United States Patent
Tsuda et al.

(10) Patent No.: US 10,522,971 B2
(45) Date of Patent: Dec. 31, 2019

(54) LASER DIODE-DRIVING POWER SUPPLY AND LASER MACHINING APPARATUS

(71) Applicant: Mitsubishi Electric Corporation, Tokyo (JP)

(72) Inventors: Shingo Tsuda, Tokyo (JP); Takeshi Morimoto, Tokyo (JP); Taichiro Tamida, Tokyo (JP); Teruaki Fukuoka, Tokyo (JP); Hiroshi Ikarashi, Tokyo (JP); Akihiko Iwata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/342,995

(22) PCT Filed: Apr. 17, 2017

(86) PCT No.: PCT/JP2017/015493
§ 371 (c)(1),
(2) Date: Apr. 18, 2019

(87) PCT Pub. No.: WO2018/193506
PCT Pub. Date: Oct. 25, 2018

(65) Prior Publication Data
US 2019/0356109 A1 Nov. 21, 2019

(51) Int. Cl.
*H01S 5/042* (2006.01)
*H01S 5/40* (2006.01)
(Continued)

(52) U.S. Cl.
CPC ........ *H01S 5/0428* (2013.01); *B23K 26/0626* (2013.01); *H01S 5/4018* (2013.01); *H02M 1/08* (2013.01); *H02M 3/33523* (2013.01)

(58) Field of Classification Search
CPC ........ H01S 5/0428; H01S 5/4018; H01S 3/10; B23K 26/0626; H02M 3/33523; H02M 1/08
See application file for complete search history.

(56) References Cited

U.S. PATENT DOCUMENTS 10,096,972 B1 * 10/2018 Tsuda ...................... H01S 5/062
10,361,536 B2 * 7/2019 Tsuda ...................... H01S 5/042
(Continued)

FOREIGN PATENT DOCUMENTS

| JP | 04-259277 A | 9/1992 |
|---|---|---|
| JP | 2004-134740 A | 4/2004 |

(Continued)

OTHER PUBLICATIONS

International Search Report dated Jun. 20, 2017 for PCT/JP2017/015493 filed on Apr. 17, 2017, 6 pages including English Translation.
(Continued)

*Primary Examiner* — Armando Rodriguez
(74) *Attorney, Agent, or Firm* — Xsensus LLP (57) ABSTRACT

A laser diode-driving power supply includes a constant current source that supplies current to LDs, a switching element connected in parallel to the LDs, and a control unit that controls the constant current source and performs on-off control of the switching element. The control unit compares a first current command value and a second current command value for controlling current output from the constant current source, and when the second current command value input after the first current command value is smaller than the first current command value, applies to the LDs a voltage in the range of a voltage at which current flows through the LDs to a voltage less than the lasing threshold of the LDs when there is no output from the LDs.

10 Claims, 7 Drawing Sheets

(51) Int. Cl.
*B23K 26/06* (2014.01)
*H02M 1/08* (2006.01)
*H02M 3/335* (2006.01)

(56) References Cited

U.S. PATENT DOCUMENTS

2011/0228037 A1  9/2011  Omori et al.
2018/0097336 A1  4/2018  Tsuda et al.

FOREIGN PATENT DOCUMENTS

| JP | 2008-113050 A | 5/2008 |
| JP | 2009-123833 A | 6/2009 |
| JP | 2011-216843 A | 10/2011 |
| WO | 2016/167019 A1 | 10/2016 |

OTHER PUBLICATIONS

Decision to Grant a Patent received for Japanese Patent Application No. 2017-550950, dated Nov. 7, 2017, 6 pages including English Translation.

* cited by examiner

LASER DIODE-DRIVING POWER SUPPLY AND LASER MACHINING APPARATUS

CROSS-REFERENCE TO RELATED APPLICATIONS

The present application is based on PCT filing PCT/JP2017/015493, filed Apr. 17, 2017, the entire contents of which are incorporated herein by reference.

FIELD

The present invention relates to a constant-current-mode laser diode-driving power supply for driving laser diodes and a laser machining apparatus.

BACKGROUND

A regulator-mode laser diode (LD)-driving power supply disclosed in Patent Literature 1 has low ripple and noise and has good transient response, but produces large losses when stepping down the voltage of a constant voltage source and has low power conversion efficiency. Therefore, in recent years, to improve power conversion efficiency, switching-mode LD-driving power supplies have frequently been used.

CITATION LIST

Patent Literature

Patent Literature 1: Japanese Patent Application Laid-open No. 2008-113050

SUMMARY

Technical Problem

To obtain a high-power laser, a conventional switching-mode LD-driving power supply uses an LD module formed by arranging a plurality of LDs in series or in parallel, and causes a switching element connected in parallel to the LD module to perform on-off operation, thereby switching a current path to the LD module at high speed. In such a switching-mode LD-driving power supply, the inductance value of a smoothing reactor is set to a large value to reduce ripple current when a current drive waveform of a high pulse drive frequency is output. In a period during which a current command value is zero, the switching element connected in parallel to the LD module is turned on, and energy stored in the smoothing reactor flows back to a closed circuit of the smoothing reactor and the switching element. However, the resistance of the closed circuit is low, and the internal impedance and inductance of the closed circuit are also low. Thus, in the closed circuit, the consumption of the energy released from the smoothing reactor is low. When a second current command value lower in value than a previous first current command value is input to the power supply in this state, a pulsed minute current is superimposed on an LD drive current due to the energy not consumed in the closed circuit, and an LD drive current larger than a current set by the second current command value flows through the LDs. The conventional switching-mode LD-driving power supply is required to change laser output according to a shape to be machined. Thus, the supply of such an LD drive current to the LD module can lead to machining defects in the workpiece. Therefore, the conventional switching-mode LD-driving power supply needs to provide a standby time until the LD drive current decreases to a specified value, and turn off the switching element after the lapse of the standby time. Thus, there is a problem that machining conditions cannot be switched at high speed, and workpiece machining speed is lowered.

The present invention has been made in view of the above, and it is an object thereof to provide a laser diode-driving power supply capable of improving workpiece machining speed.

Solution to Problem

To solve the aforementioned problems and achieve the object, a laser diode-driving power supply of the present invention includes a constant current source to supply current to laser diodes, a switching element connected in parallel to the laser diodes, and a control unit to control the constant current source and perform on-off control of the switching element. The control unit compares a first current command value and a second current command value for controlling current output from the constant current source, and when the second current command value input after the first current command value is smaller than the first current command value, the control unit applies to the laser diodes a voltage in a range of a voltage at which current flows through the laser diodes to a voltage less than a lasing threshold of the laser diodes when there is no output from the laser diodes.

Advantageous Effects of Invention

The laser diode-driving power supply according to the present invention has an advantage of being able to improve workpiece machining speed.

DESCRIPTION OF EMBODIMENT

Hereinafter, a laser diode-driving power supply and a laser machining apparatus according to an embodiment of the present invention will be described in detail with reference to the drawings. Note that the embodiment is not intended to limit the invention.

Embodiment

Figure 1:
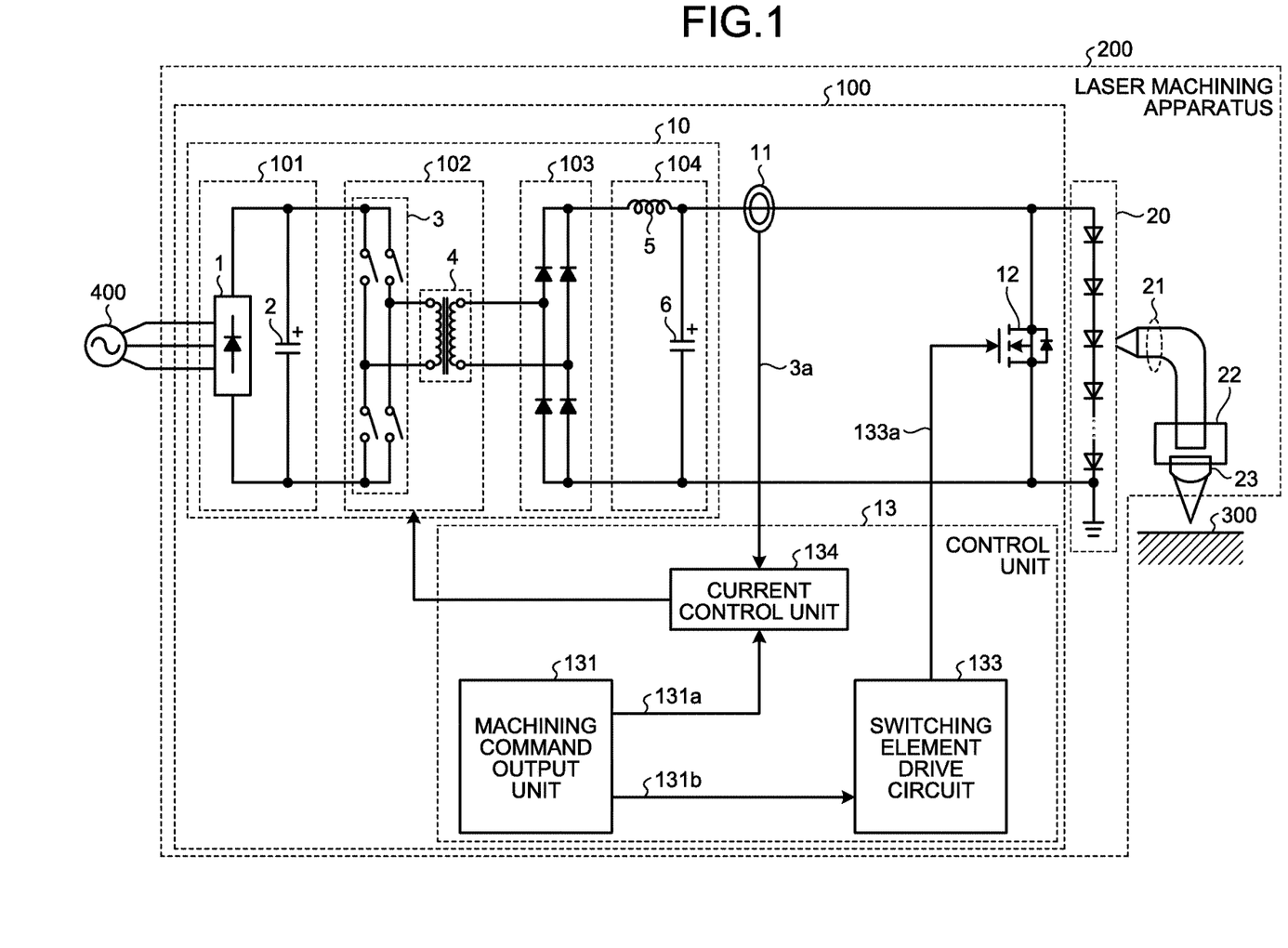
FIG. 1 is a configuration diagram of a laser diode-driving power supply and a laser machining apparatus according to an embodiment of the present invention.

FIG. 1 is a configuration diagram of a laser diode-driving power supply and a laser machining apparatus according to an embodiment of the present invention. A laser machining apparatus 200 illustrated in FIG. 1 includes a laser diode-driving power supply 100, LDs 20 that are laser diodes for emitting a laser by current supplied from the laser diode-driving power supply 100, a machining head 22 for machining a workpiece 300, and a fiber 21 that is an example of an optical coupling system and an optical amplifier for transmitting a laser emitted from the LDs 20 to the machining head 22. Hereinafter, the laser diode-driving power supply is sometimes simply referred to as a "power supply".

The power supply 100 includes a constant current source 10 that converts AC power supplied from an AC source 400 into DC power, and a current detection unit 11 that detects current supplied from the constant current source 10 to the LDs 20 and outputs it as a current value 3a. The power supply 100 also includes a switching element 12 provided between the constant current source 10 and the LDs 20 and connected in parallel to the LDs 20, and a control unit 13 that controls the value of current output from the constant current source 10 and performs the on-off control of the switching element 12 to control the output of the LDs 20s.

The control unit 13 includes a machining command output unit 131 that outputs a current command value 131a and a beam-on signal 131b as machining commands, a switching element drive circuit 133 that converts the beam-on signal 131b into a drive signal 133a capable of driving the switching element 12 and outputs it, and a current control unit 134 that controls the operation of the constant current source 10 according to the current command value 131a, thereby controlling the value of current supplied to the LDs 20. The current command value 131a is a command value for controlling current supplied to the LDs 20. The beam-on signal 131b is a signal for emitting a laser beam from the LDs 20, and is a rectangular signal similar to the drive signal 133a described later. The current control unit 134 outputs a drive signal for controlling the operation of the constant current source 10 so that the current value 3a detected by the current detection unit 11 agrees with the current command value 131a.

The constant current source 10 is a constant-current-mode power converter that converts AC power supplied from the AC source 400 into DC power based on a drive signal output from the current control unit 134. The constant current source 10 includes a rectification unit 101 for rectifying AC power supplied from the AC source 400, and a switching circuit 102 for converting power output from the rectification unit 101 into AC power by single-phase full-bridge inverter operation. The constant current source 10 also includes a rectification circuit 103 for rectifying AC voltage output from the switching circuit 102 and a smoothing circuit 104 for smoothing voltage rectified by the rectification circuit 103.

The rectification unit 101 includes a rectification circuit 1 for rectifying AC power supplied from the AC source 400, and a smoothing capacitor 2 connected in parallel to the rectification circuit 1. The switching circuit 102 is an isolated-type power conversion unit. The switching circuit 102 includes a single-phase full-bridge inverter circuit 3 that converts voltage rectified by the rectification unit 101 into AC voltage, based on a drive signal output from the current control unit 134, and a transformer 4 that converts voltage converted in the single-phase full-bridge inverter circuit 3 into voltage of a specified value corresponding to the turns ratio. Output voltage of the transformer 4 is adjusted by the turns ratio of the transformer 4. Output current of the transformer 4 is adjusted by the ratio of on-time to the switching period of a plurality of switching elements constituting the single-phase full-bridge inverter circuit 3.

The rectification circuit 103 is a full-wave rectification circuit composed of four diodes, but the configuration of the rectification circuit 103 is not limited to this. For the rectification circuit 103, Metal-Oxide Semiconductor Field-Effect Transistors (MOSFETs) may be used in place of the diodes.

The smoothing circuit 104 includes a reactor 5 having one end connected to the rectification circuit 103 and the other end connected to one end of the LDs 20, and a smoothing capacitor 6. One end of the smoothing capacitor 6 is connected to the other end of the reactor 5 and also connected to the one end of the LDs 20. The other end of the smoothing capacitor 6 is connected to the rectification circuit 103 and also connected to the other end of the LDs 20.

In the laser machining apparatus 200 thus configured, by current being supplied from the power supply 100 to the LDs 20, a laser is emitted from the LDs 20. The laser emitted from the LDs 20 is transmitted to the machining head 22 by the fiber 21, and focused on the workpiece 300 by a lens 23 in the machining head 22. Thus, cutting of the workpiece 300 is performed. During machining of the workpiece 300, it is necessary to move the laser focus position on the workpiece 300. Thus, the workpiece 300 is placed on a workpiece moving mechanism (not illustrated) for moving the workpiece 300, or a head moving mechanism (not illustrated) for moving the machining head 22 is provided to the laser machining apparatus 200.

The value of current supplied from the power supply 100 to the LDs 20 is detected by the current detection unit 11. The current control unit 134 of the control unit 13 adjusts the on-time of the plurality of switching elements constituting the single-phase full-bridge inverter circuit 3 so that the current value 3a detected by the current detection unit 11 agrees with the current command value 131a. When the switching element 12 is off, current output from the constant current source 10 flows through the LDs 20, and when the switching element 12 is on, no current flows through the LDs 20. In this manner, current flowing through the LDs 20 is adjusted. That is, during pulse driving of the laser, the power supply 100 switches a current path through which the output current of the constant current source 10 flows by turning the switching element 12 on and off. By the current path being switched instantaneously, the current to the LDs 20 can fall or rise at high speed. When the drive current to the LDs 20 is large, the switching element 12 may be provided with a snubber circuit for reducing surge voltage produced when the switching element 12 is turned off.

Figure 2:
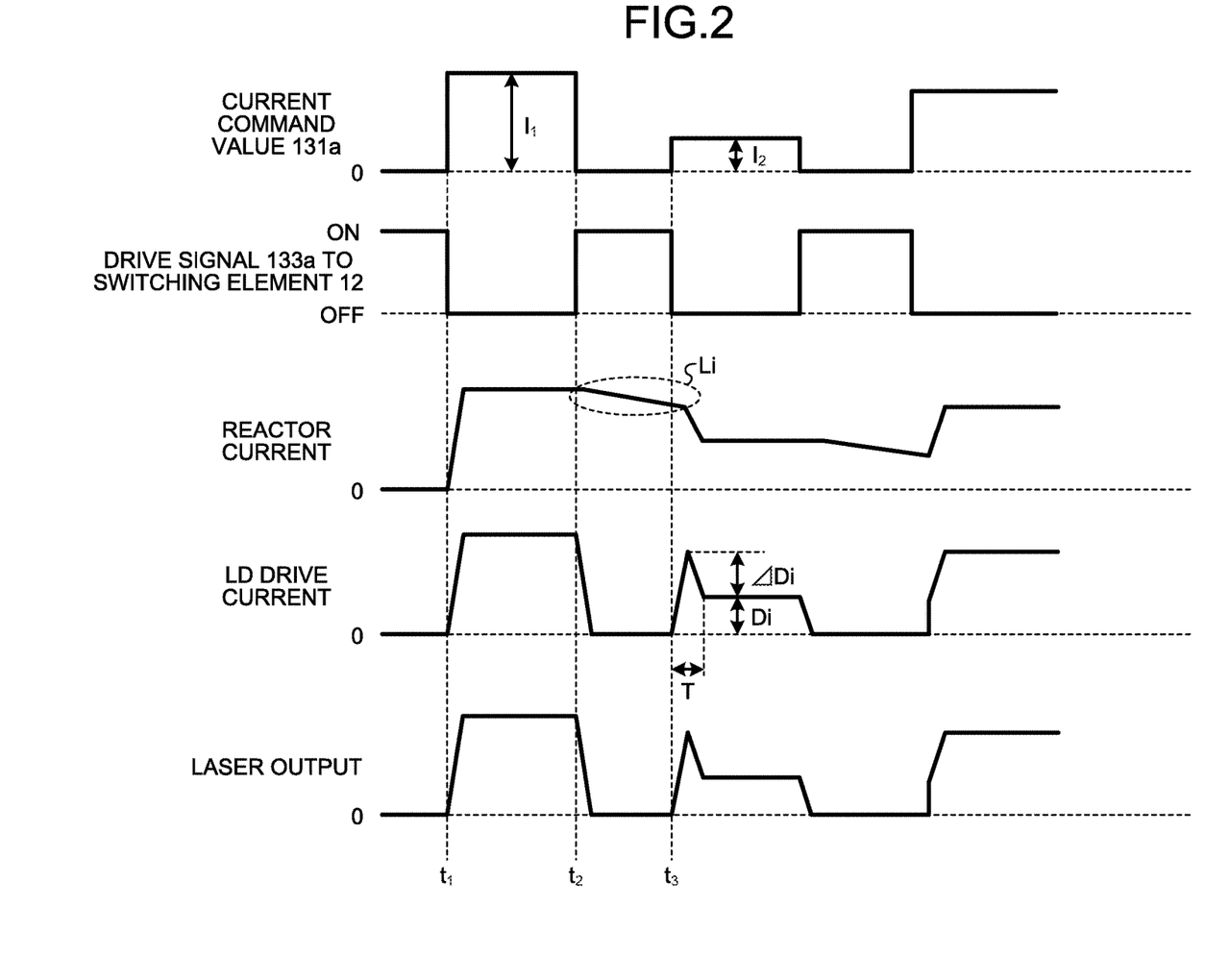
FIG. 2 is a timing chart illustrating an operation of a switching-mode laser machining apparatus according to a comparative example.

In the switching-mode laser machining apparatus 200 thus configured, the inductance value of the reactor 5 in the smoothing circuit 104 is set to a large value to reduce output ripple current as described above. FIG. 2 is a timing chart illustrating an operation of a switching-mode laser machining apparatus according to a comparative example. FIG. 2 illustrates, in the order from top, the current command value 131a input to the current control unit 134, the drive signal 133a to the switching element 12, a reactor current that is a current value detected by the current detection unit 11 when energy stored in the reactor 5 is released, an LD drive current that is a current flowing through the LDs 20, and a laser output.

As illustrated in FIG. 2, in the switching-mode laser machining apparatus according to the comparative example, when the switching element 12 is switched from on to off at the timing of a time $t_1$, and a first current command value $I_1$ that is the current command value 131a is output, a reactor current and an LD drive current flow, providing a constant laser output.

In the switching-mode laser machining apparatus according to the comparative example, when the switching element 12 is switched from off to on at the timing of a time $t_2$ after the lapse of a certain period of time from the time $t_1$, and the current command value 131a is set to zero, energy stored in the reactor 5 flows back to the closed circuit formed by the reactor 5 and the switching element 12. However, since the resistance of the closed circuit is low, and the internal impedance and inductance of the closed circuit are also low, the consumption of the energy in the closed circuit is low. Consequently, a reactor current as indicated by reference symbol Li continues to flow in the closed circuit.

In this state, when the switching element 12 is switched from on to off at the timing of a time $t_3$ after the lapse of a certain period of time from the time $t_2$, and a second current command value $I_2$ is input, an LD drive current denoted by reference symbol Di takes a form with a minute current denoted by reference symbol ΔDi superimposed thereon due to the high-value reactor current Li, and an LD drive current higher than a value set by the second current command value $I_2$ flows. The second current command value $I_2$ is the current command value 131a smaller than the first current command value $I_1$. The switching-mode laser machining apparatus needs to change laser output according to a shape to be machined. Thus, the supply of such an LD drive current to the LDs can lead to machining defects in the workpiece 300. Therefore, the switching-mode laser machining apparatus needs to provide a standby time until the LD drive current decreases to the value set by the second current command value $I_2$, and turn the switching element 12 off after the lapse of the standby time. Consequently, there is a problem that machining conditions cannot be switched at high speed, and the machining speed of the workpiece 300 is lowered, resulting in reduced productivity of machined products.

By contrast, the control unit 13 of the laser machining apparatus 200 according to the present embodiment compares the second current command value $I_2$ with the first current command value $I_1$. When the second current command value $I_2$ is smaller than the first current command value $I_1$, the control unit 13 applies to the LDs 20 a voltage in the range of a voltage at which current flows through the LDs 20 to a voltage less than the lasing threshold of the LDs 20 when there is no output from the LDs 20. Thus, the energy released from the reactor 5 can be consumed by the LDs 20 during the period from the time $t_2$ to the time $t_3$. Consequently, the standby time can be shortened, and the machining conditions can be switched at high speed even when a different current command value is set each time the switching element 12 is switched from on to off.

Figure 3:
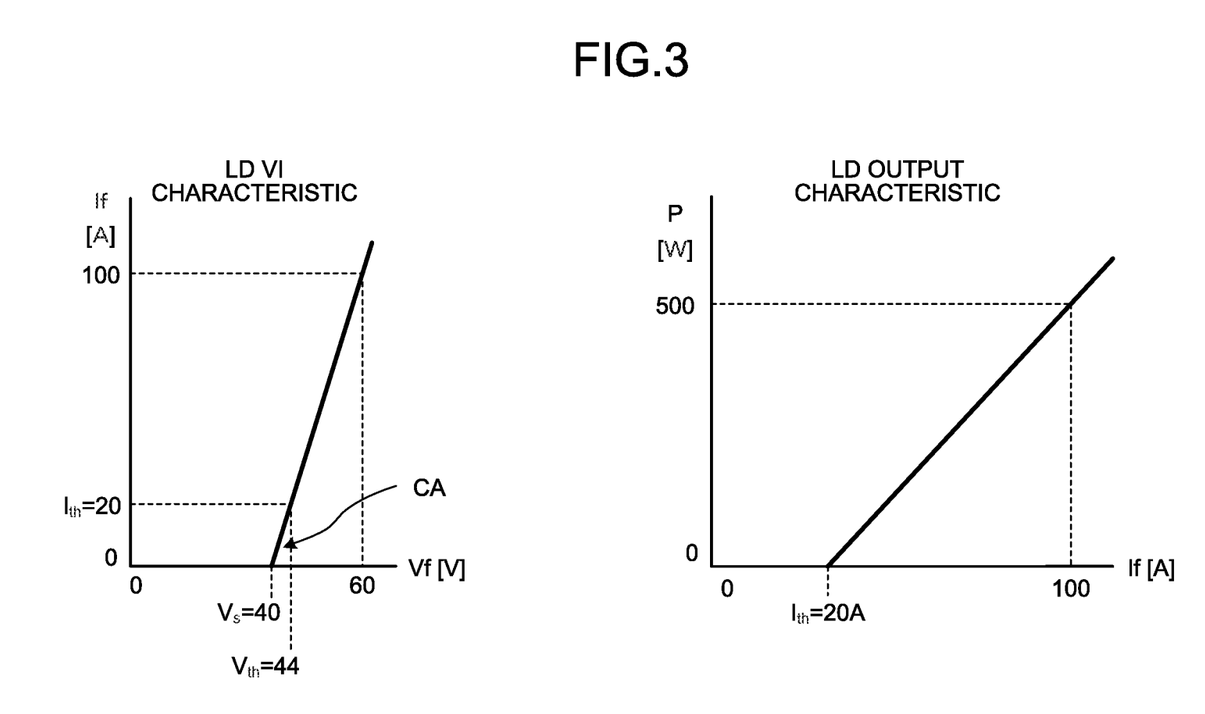
FIG. 3 is graphs illustrating the characteristics of LDs illustrated in FIG. 1.

FIG. 3 is graphs illustrating the characteristics of the LDs illustrated in FIG. 1. The VI characteristic of the LDs 20 is illustrated on the left in FIG. 3, in which the horizontal axis represents forward voltage Vf [V] to the LDs 20, and the vertical axis represents forward current If [A] in the LDs 20. $I_{th}$ is the lasing threshold current of the LDs 20, and $V_{th}$ is the lasing threshold voltage. $V_s$ is a voltage at which current starts to flow through the LDs 20 among forward voltages Vf applied to the LDs 20. In the VI characteristic in FIG. 3, the lasing threshold current $I_{th}$ is 20 [A], the voltage $V_s$ is 40 [V], and the lasing threshold voltage $V_{th}$ is 44[V]. Thus, the semiconductor laser using the LDs 20 is a laser having a resonator, and thus has the lasing threshold current $I_{th}$ for lasing, unlike light-emitting diodes.

An area CA illustrated in the VI characteristic in FIG. 3 is an area corresponding to the forward voltage Vf applied to the LDs 20 such that the current fed through the LDs 20 is equal to or higher than 0 [A] and less than the lasing threshold current $I_{th}$ during beam-off time, that is, when the switching element 12 illustrated in FIG. 1 is on. That is, according to the VI characteristic in FIG. 3, when a voltage from 40[V] to 44[V] is applied to the LDs 20, the forward current If less than the lasing threshold current $I_{th}$ flows through the LDs 20.

The output characteristic of the LDs 20 is illustrated on the right in FIG. 3, in which the horizontal axis represents forward current If [A] in the LDs 20, and the vertical axis represents laser output P [W] from the LDs 20. According to the output characteristic of the LDs 20, when the forward current If less than the lasing threshold current $I_{th}$ flows through the LDs 20, the LDs 20 do not oscillate, and the laser output P is 0 [W]. In an area where the value of the forward current If is higher than the lasing threshold current $I_{th}$, the LDs 20 have characteristics that the laser output increases in proportion to the current.

The problem of the laser machining apparatus according to the comparative example described above is that energy released from the reactor 5 cannot be consumed during beam-off time. The laser machining apparatus 200 according to the present embodiment controls the forward voltage Vf applied to the LDs 20 such that current flowing through the LDs 20 during beam-off time is equal to or higher than 0 [A] and less than the lasing threshold current $I_{th}$, using the output characteristic of the LDs 20 illustrated in FIG. 3. The laser machining apparatus 200 according to the present embodiment uses the property of varying conduction resistance of the switching element 12 to control the forward voltage Vf applied to the LDs 20. This will be described with reference to FIG. 4.

Figure 4:
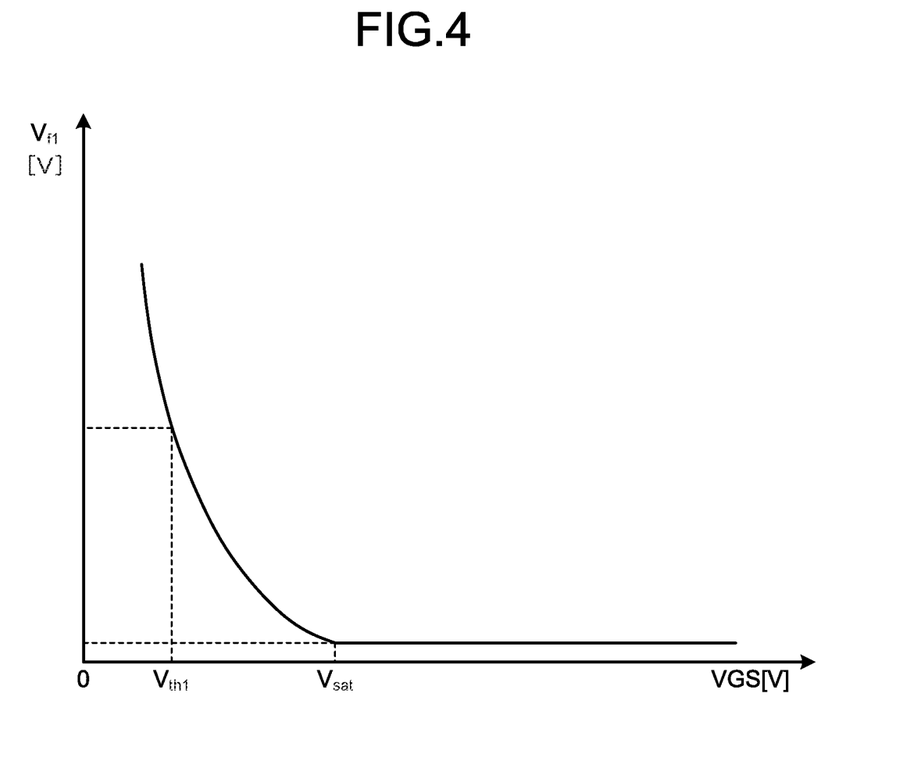
FIG. 4 is a graph for explaining a control operation of a switching element by the laser diode-driving power supply according to the embodiment of the present invention.

FIG. 4 is a graph for explaining an operation of controlling the switching element by the laser diode-driving power supply according to the embodiment of the present invention. The horizontal axis in FIG. 4 represents the gate-source voltage VGS of the switching element 12, and the vertical axis in FIG. 4 represents the forward voltage $V_{f1}$ of the switching element 12. $V_{th1}$ is the gate threshold voltage, and $V_{sat}$ is the gate saturation voltage. To control the forward voltage Vf applied to the LDs 20, the laser diode-driving power supply 100 according to the present embodiment uses the property of varying conduction resistance of the switching element 12. Specifically, when the drive signal 133a corresponding to a gate voltage in the range of the gate threshold voltage $V_{th1}$ to the gate saturation voltage $V_{sat}$ in FIG. 4 is output during beam-off time, the value of the forward voltage Vf illustrated on the left in FIG. 3 is in the range of the voltage $V_s$ to the lasing threshold voltage $V_{th}$. Consequently, a load voltage is generated even during beam-off time, and energy stored in the reactor 5 of the constant current source 10 can be consumed.

Figure 5:
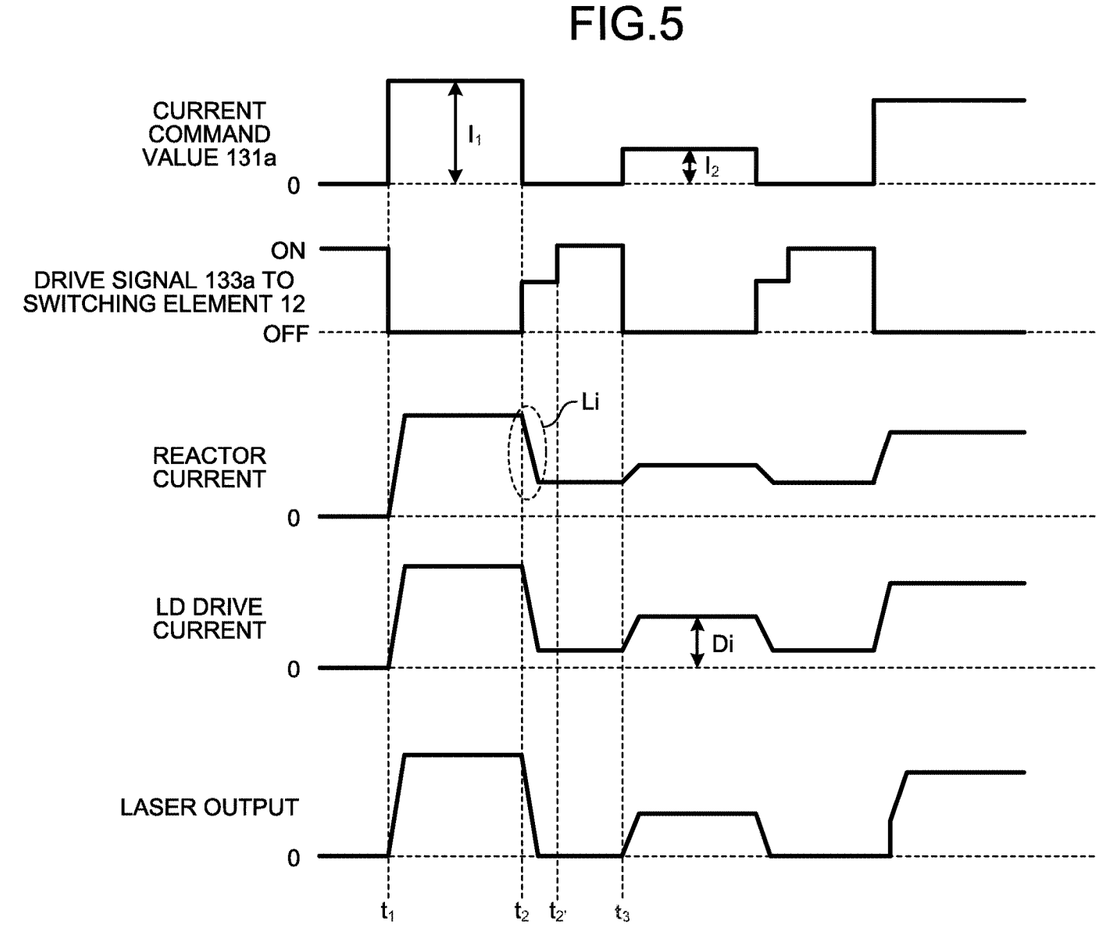
FIG. 5 is a timing chart illustrating an operation of the laser machining apparatus according to the embodiment of the present invention.

FIG. 5 is a timing chart illustrating an operation of the laser machining apparatus according to the embodiment of the present invention. Like FIG. 2, FIG. 5 illustrates the current command value 131a, the drive signal 133a to the switching element 12, the reactor current, the LD drive current, and the laser output. In the laser machining apparatus 200, at the timing of the time $t_2$, the drive signal 133a corresponding to a gate voltage in the range of the gate threshold voltage $V_{th1}$ to the gate saturation voltage $V_{sat}$ illustrated in FIG. 4 is applied to the switching element 12. At this time, the reactor current Li as illustrated in FIG. 5 flows through the LDs 20, and an LD drive current flows. The value of the LD drive current is less than the lasing threshold current $I_{th}$ illustrated in FIG. 3, and thus the LDs 20 do not perform laser output, and consume the energy released from the reactor 5.

Then, in the laser machining apparatus 200, at the timing of a time $t_{2'}$ after the lapse of a certain period of time from the time $t_2$, the drive signal 133a corresponding to a gate voltage higher than the gate saturation voltage $V_{sat}$ illustrated in FIG. 4 is applied to the switching element 12. At this time, the reactor current flowing back to the closed circuit formed by the reactor 5 and the switching element 12 has a value lower than the value of the reactor current flowing from the time $t_2$ to the time $t_3$ illustrated in FIG. 2.

When the switching element 12 is switched from on to off and the second current command value $I_2$ is input at the timing of the time $t_3$ after the lapse of a certain period of time from the time $t_{2'}$, the LD drive current Di set by the second current command value $I_2$ flows. Note that the period from the time $t_2$ to the time $t_{2'}$ has a value smaller than the value of the period from the time $t_2$ to the time $t_3$. The period from the time $t_2$ to the time $t_{2'}$ is set to a length to allow the energy released from the reactor 5 to be consumed so that the LD drive current Di becomes equal to the second current command value $I_2$.

Thus, the laser machining apparatus 200 according to the present embodiment sets the voltage applied across the LDs 20 during beam-off time to a value equal to or higher than the voltage $V_s$ at which current flows through the LDs 20 and lower than the lasing threshold voltage $V_{th}$ of the LDs 20, to generate a load voltage during beam-off time to consume energy stored in the reactor 5 of the constant current source 10. This configuration allows the machining conditions to be switched at high speed even when a different current command value is set each time the switching element 12 is switched from on to off.

Further, the laser machining apparatus 200 according to the present embodiment can control the timing of driving the switching element 12 according to the machining conditions. Specifically, the user enters optimum machining conditions for an object to be machined into a computer numerical control device beforehand to program timings to change the current command value according to the shape of the workpiece. The control unit 13 of the laser machining apparatus 200 reads the current command value ahead based on the program input into the computer numerical control device. When the second current command value to be input by the next laser pulse is smaller than the first current command value input by the previous laser pulse, the control unit 13 causes the energy to be consumed until the reactor current that is the detected current value 3a has a value equal to the second current command value, using the property of varying conduction resistance of the switching element 12, and then brings the switching element 12 into an on state. When the second current command value is larger than the first current command value, the laser machining apparatus 200 may bring the switching element 12 into an on state, and change the second current command value during pulse-off time. By thus controlling the time to turn on the switching element 12, the energy is consumed until the second current command value is input, and the rise and fall of a laser pulse can be increased in speed.

Further, according to the laser diode-driving power supply 100 and the laser machining apparatus 200 according to the present embodiment, the following effects can be obtained. When the on-off operation of the laser output is repeated, thermal stress due to a temperature difference between the temperature of the LDs 20 when the laser output is turned on and the temperature of the LDs 20 when the laser output is turned off is repeatedly applied to the LDs 20. Consequently, solder cracks may occur at joints between chips and bonding wires constituting the LDs 20, leading to a failure. To prolong the life of the LDs 20, it is necessary to reduce the amount of change in junction temperature of the LDs 20. In the laser diode-driving power supply 100 and the laser machining apparatus 200 according to the embodiment, as illustrated in FIG. 5, the LD drive current less than the lasing threshold current $I_{th}$ flows during the period from the time $t_2$ to the time $t_3$. Thus, compared to the case where such an LD drive current does not flow, the temperature of the LDs 20 when the laser output is off is increased, and the amount of change in junction temperature of the LDs 20 is reduced. Consequently, the life of the LDs 20 can be prolonged.

Figure 6:
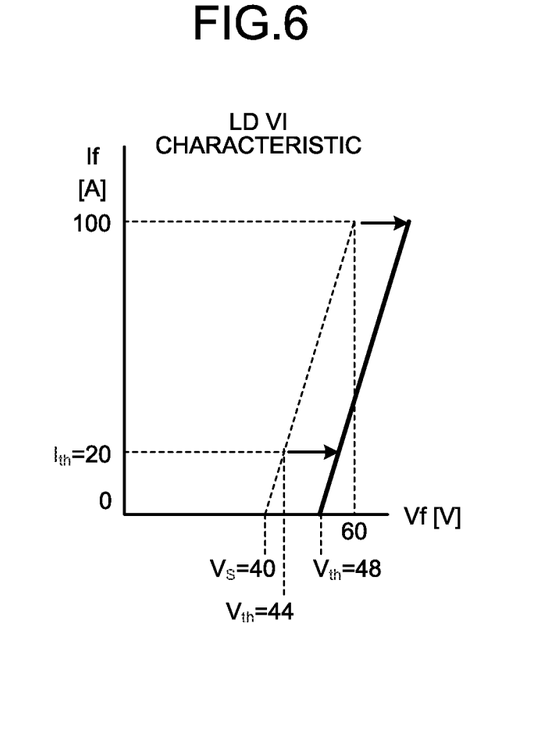
FIG. 6 is a graph illustrating the VI characteristic of the LDs before and after the control of the conduction resistance of the switching element.

The VI characteristic of the LDs 20 changes due to aged deterioration. Thus, when the VI characteristic changes, the range of voltage applied across the LDs 20 during beam-off time, that is, the range between the voltage $V_s$ at which current flows through the LDs 20 and the lasing threshold voltage $V_{th}$ of the LDs 20 inclusive changes. The laser diode-driving power supply 100 monitors the laser output. Thus, the laser diode-driving power supply 100 may control the conduction resistance of the switching element 12, based on the voltage applied across the LDs 20, the current flowing through the LDs 20, and the laser output. FIG. 6 is a graph illustrating the VI characteristic of the LDs before and after the control of the conduction resistance of the switching element. Like the graph on the left in FIG. 3, FIG. 6 illustrates the VI characteristic of the LDs 20. In FIG. 6, the lasing threshold voltage $V_{th}$ before the LDs 20 deteriorate from aging is 44[V], and the lasing threshold voltage $V_{th}$ after the LDs 20 have deteriorated from aging is 48[V]. In the laser diode-driving power supply 100, the value of the drive signal 133a corresponding to a gate voltage in the range of the gate threshold voltage $V_{th1}$ to the gate saturation pressure $V_{sat}$ illustrated in FIG. 4 is adjusted so that the LDs 20 has the lasing threshold voltage $V_{th}$ corresponding to the degree of its aged deterioration. In this case, a voltage correspondence table may be set in the control unit 13, and a plurality of drive signal values corresponding to gate voltages from the gate threshold voltage $V_{th1}$ to the gate saturation voltage $V_{sat}$ may be associated with time in the voltage correspondence table, and a drive signal value may be selected according to an elapsed time from the point in time when the operation of the laser diode-driving power supply 100 is started to the present point in time.

Figure 7:
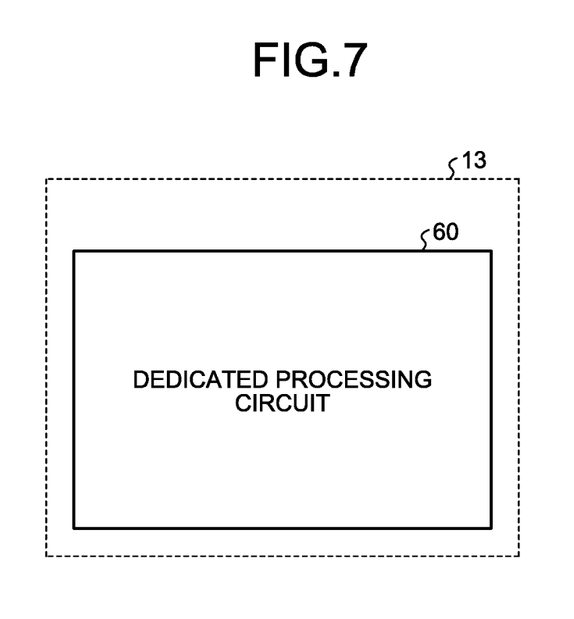
FIG. 7 is a diagram illustrating a first hardware configuration example of a control unit of the laser diode-driving power supply according to the embodiment of the present invention.
Figure 8:
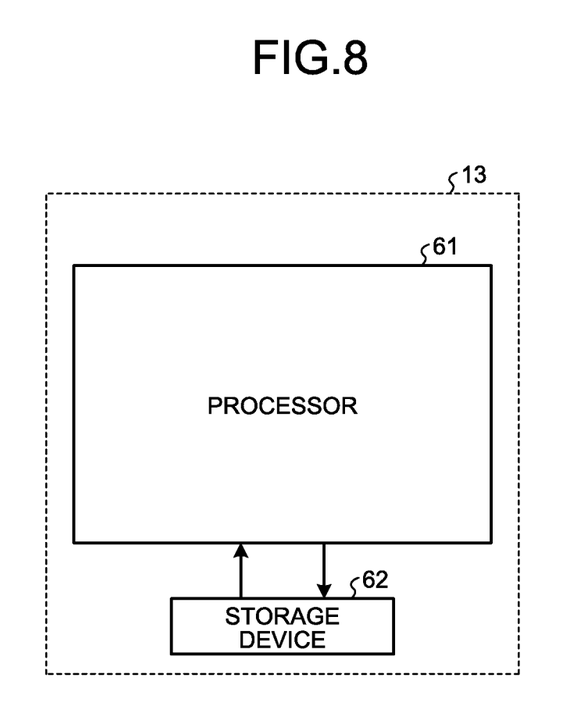
FIG. 8 is a diagram illustrating a second hardware configuration example of the control unit of the laser diode-driving power supply according to the embodiment of the present invention.

The functions of the control unit 13 of the laser diode-driving power supply 100 according to the present embodiment can be implemented by using a processing circuit. The functions are the machining command output unit 131, the switching element drive circuit 133, and the current control unit 134. FIG. 7 is a diagram illustrating a first hardware configuration example of the control unit of the laser diode-driving power supply according to the embodiment of the present invention. FIG. 8 is a diagram illustrating a second hardware configuration example of the control unit of the laser diode-driving power supply according to the embodiment of the present invention. FIG. 7 illustrates an example in which the processing circuit is implemented by dedicated hardware such as a dedicated processing circuit 60. FIG. 8 illustrates an example in which the processing circuit is implemented by a processor 61 and a storage device 62.

When dedicated hardware is used as illustrated in FIG. 7, the dedicated processing circuit 60 corresponds to a single circuit, a combined circuit, a programmed processor, a parallel-programmed processor, an Application Specific Integrated Circuit (ASIC), a Field Programmable Gate Array (FPGA), or a combination of them. The above-described functions may be individually implemented by a processing circuit, or may be collectively implemented by a processing circuit.

When the processor 61 and the storage device 62 are used as illustrated in FIG. 8, each of the above-described functions is implemented by software, firmware, or a combination of them. Software or firmware is described as programs and stored in the storage device 62. The processor 61 reads and executes the programs stored in the storage device 62. These programs can be said to cause a computer to execute procedures and methods executed by the above-described functions. The storage device 62 corresponds to semiconductor memory such as Random Access Memory (RAM), Read Only Memory (ROM), flash memory, an Erasable Programmable Read Only Memory (EPROM), or an Electrically Erasable Programmable Read Only Memory (EEPROM). The semiconductor memory may be nonvolatile memory or volatile memory. Other than the semiconductor memory, the storage device 62 corresponds to a magnetic disk, a flexible disk, an optical disk, a compact disk, a mini disk, or a Digital Versatile Disc (DVD).

In the present embodiment, the machining command output unit 131 is provided in the control unit 13. Alternatively, the machining command output unit 131 may be provided outside the laser diode-driving power supply 100 or the laser machining apparatus 200. In the present embodiment, the rectification circuit 103 is composed of a plurality of diodes. Alternatively, the rectification circuit 103 may be a synchronous rectification-mode circuit composed of a plurality of switching elements. In the rectification circuit 103 composed of a plurality of diodes, forward voltages corresponding to voltage drops produced in the diodes are losses. In synchronous rectification, loss voltage in the rectification circuit 103 can be further reduced, and thus the synchronous rectification-mode rectification circuit 103 can increase the power conversion efficiency of the power supply 100.

In the present embodiment, the current detection unit 11 is used. Alternatively, the current control unit 134 of the laser machining apparatus 200 may output a drive signal corresponding to the first current command value $I_1$ or the second current command value $I_2$ without using the current value 3a detected by the current detection unit 11, that is, may control in an open loop. However, by using the current value 3a detected by the current detection unit 11, the accuracy of controlling current supplied to the LDs 20 is improved, so that the laser output accuracy of the LDs 20 is enhanced, and the machining quality of the workpiece 300 is further improved.

In FIG. 5, the value of the drive signal 133a from the time $t_{2'}$ to the time $t_3$ is made higher than the value of the drive signal 133a from the time $t_2$ to the time $t_{2'}$. That is, the control unit 13 applies the drive signal 133a changing from small to large to the switching element 12 when there is no output from the LDs 20. However, the change of the drive signal 133a is not limited to this. The value of the drive signal 133a from the time $t_{2'}$ to the time $t_3$ may be made equal to the value of the drive signal 133a from the time $t_2$ to the time $t_{2'}$. That is, when the second current command value $I_2$ read ahead is smaller than the first current command value $I_1$, the control unit 13 of the laser diode-driving power supply 100 may maintain the value of the drive signal 133a that brings the value of the voltage applied to the LDs 20 into the above-described voltage range constant. This configuration causes the energy released from the reactor 5 before the second current command value $I_2$ is input to be consumed more, and thus can change the machining conditions at a higher speed than when the value of the drive signal 133a is changed.

As described above, the control unit 13 of the laser machining apparatus 200 according to the present embodiment outputs to the switching element 12 the drive signal 133a to bring the value of the voltage applied to the LDs 20 into the range of the voltage $V_s$ to the lasing threshold voltage $V_{th}$ when there is no output from the LDs 20. This allows the energy released from the reactor 5 to be consumed by the LDs 20, and allows the machining conditions to be switched at high speed even when a different current command value is set each time the switching element 12 is switched from on to off. Consequently, the machining speed of the workpiece 300 is improved, and the advantage of improving the productivity of machined products can be obtained.

The configuration illustrated in the above embodiment illustrates an example of the subject matter of the present invention, and can be combined with another known art, and can be partly omitted or changed without departing from the scope of the present invention.

REFERENCE SIGNS LIST

1, 103 rectification circuit; 2, 6 smoothing capacitor; 3 single-phase full-bridge inverter circuit; 3a current value; 4 transformer; 5 reactor; 10 constant current source; 11 current detection unit; 12 switching element; 13 control unit; 20 LD; 21 fiber; 22 machining head; 23 lens; 60 dedicated processing circuit; 61 processor; 62 storage device; 100 laser diode-driving power supply; 101 rectification unit; 102 switching circuit; 104 smoothing circuit; 131 machining command output unit; 131a current command value; 131b beam-on signal; 133 switching element drive circuit; 133a drive signal; 134 current control unit; 200 laser machining apparatus; 300 workpiece; 400 AC source.

The invention claimed is:

1. A laser diode-driving power supply, comprising:
   a constant current source to supply current to laser diodes;
   a switching element connected in parallel to the laser diodes; and
   a control circuit to control the constant current source and perform on-off control of the switching element,
   wherein the control circuit compares a first current command value and a second current command value for controlling current output from the constant current source, and
   when the second current command value input after the first current command value is smaller than the first current command value, the control circuit applies to the laser diodes a voltage in a range of a voltage at which current flows through the laser diodes to a voltage less than a lasing threshold of the laser diodes when there is no output from the laser diodes.

2. The laser diode-driving power supply according to claim 1, wherein the control circuit applies a drive signal corresponding to a voltage in a range of a gate threshold voltage to a gate saturation voltage to the switching element when there is no output from the laser diodes.

3. The laser diode-driving power supply according to claim 2, wherein the control circuit maintains a value of the drive signal constant.

4. The laser diode-driving power supply according to claim 2, wherein a value of the drive signal is changed to a lasing threshold voltage in response to changes in a characteristic of the laser diodes.

5. The laser diode-driving power supply according to claim 1, wherein the control circuit applies a drive signal changing from small to large to the switching element when there is no output from the laser diodes.

6. A laser machining apparatus comprising the laser diode-driving power supply according to claim 1.

7. A laser machining apparatus comprising the laser diode-driving power supply according to claim 2.

8. A laser machining apparatus comprising the laser diode-driving power supply according to claim 3.

9. A laser machining apparatus comprising the laser diode-driving power supply according to claim 4.

10. A laser machining apparatus comprising the laser diode-driving power supply according to claim 5.

* * * * *